United States Patent [19] — [11] 3,886,584
Cook, Jr. et al. — [45] May 27, 1975

United States Patent [19]

Cook, Jr. et al.

[11] 3,886,584

[45] May 27, 1975

[54] RADIATION HARDENED MIS DEVICES

[75] Inventors: Koy B. Cook, Jr., Satellite Beach; Jimmy L. Davidson; Joseph D. Gibson, both of Melbourne Beach; Raymond B. Patterson, III, Eau Gallie, all of Fla.

[73] Assignee: Harris Corporation, Cleveland, Ohio

[22] Filed: Jan. 30, 1973

[21] Appl. No.: 328,032

Related U.S. Application Data

[63] Continuation of Ser. No. 92,074, Nov. 23, 1970, abandoned.

[52] U.S. Cl. .......................... 357/23; 357/29; 357/53
[51] Int. Cl. .......................... H01l 5/06
[58] Field of Search .......................... 317/235 B, 235 AG

[56] References Cited

UNITED STATES PATENTS

| | | | |
|---|---|---|---|
| 3,413,573 | 11/1968 | Nathamson | 317/235 B |
| 3,553,540 | 1/1971 | Puterbaugh | 317/235 B |
| 3,564,354 | 2/1971 | Aoki | 317/234 N |
| 3,570,112 | 3/1971 | Barry et al. | 317/235 B |

OTHER PUBLICATIONS

Waxman et al., "$Al_2O_3$ Silicon Insulated Gate Field Effect Transistor," Applied Physics Letters 12, 109, (1968).

*Primary Examiner*—Rudolph V. Rolinec
*Assistant Examiner*—William D. Larkins
*Attorney, Agent, or Firm*—Fidelman, Wolffe & Leitner

[57] ABSTRACT

An insulated gate field effect transistor is characterized by heavily doped source and drain regions separated by a channel in the surface layer of a silicon body. Above the silicon surface of the channel lies a metal layer constituting a gate electrode. The gate electrode is separated from a passivating layer immediately overlying the channel surface, by an open space having a width much greater than the thickness of the passivating layer.

The open space is defined by the thickness of a layer of material formerly interposed between the metal layer and the passivating layer but subsequently removed during the fabrication of the field transistor.

6 Claims, 3 Drawing Figures

INVENTORS

KOY B. COOK, JR.
JIMMY L. DAVIDSON
JOSEPH D. GIBSON
RAYMOND B. PATTERSON, III

BY Donald R. Greene

RADIATION HARDENED MIS DEVICES

This is a continuation of application Ser. No. 92,074, filed Nov. 23, 1970, now abandoned.

BACKGROUND

1. Field of the Invention

The present invention pertains generally to the field of semiconductor devices and circuits, and is particularly directed to techniques for radiation hardening of semiconductor devices.

2. Discussion of Prior Art

When semiconductor devices are exposed to nuclear irradiation, as occurs in outer space, during nuclear explosions, and in earthbound reactor instrument applications, the device undergo some degree of instability and unreliability. The effects of such irradiation are especially pronounced in devices relying on some form of electrical charge storing function for their operation. The latter devices include those fabricated using metal-insulatorsilicon (MIS) techniques, such as the insulated- (or isolated-) gate field-effect transistor (IGFET) and MIS capacitor.

Typical practices heretofore employed to reduce the effect of nuclear irradiation on these MIS devices, that is, to render them radiation hardened, involve the use of hard insulators such as $Al_2O_3$, the sandwiching of a radiation-hard layer, such as silicon nitride, $Si_3N_4$, between the metal and the insulator (typically silicon dioxide, $SiO_2$); or the addition of ions of a getter material, such as phosphorous or nitrogen, to the oxide (i.e., insulator) layer to reduce the effect of irradiation. Without radiation hardening of the device, a charge is built up in the oxide layer as the incoming radiation particles cause electrons to escape therefrom. In the case of the IGFET, the effect is identical to that which occurs by placing a voltage on the gate, and is altogether undesirable when it occurs in response to spurious radiation. Unfortunately, the prior techniques of radiation hardening, including those described above, have not been completely effective except in very mild radiation environments.

Accordingly, it is a principal object of the present invention to provide improved radiation hardening in MIS devices, and processes for introducing such improved radiation hardening, when compared to prior art devices and techniques.

SUMMARY OF THE INVENTION

Briefly, according to the principal feature of the present invention, a radiation hardened MIS device is fabricated by the provision of a space, or gap, between the metal layer and the passivation (insulator) layer of the device. The term space, or gap, is defined for purposes of the present disclosure and the claims appended hereto, as a region devoid of solid or liquid material or any combination of those materials, but which region contains a gas (including the presence of a gas at a pressure sufficiently low to constitute a vacuum within the region), such as air. Preferably, the pressure of the gas is less than atmospheric, and further, down to realizable vacuum.

The presence of this space between the metal layer and the passivation layer reduces the capability of the gate insulator to assume or to retain an undesirable electrical charge in the presence of nuclear irradiation, since the mechanism which results in such a charge is virtually ineffectual in the case of a gas or of a complete void.

According to another aspect of the present invention, the solid insulator layer overlying the silicon of the MIS device is very thin in comparison to the thickness (width) of the space referred to above. This further reduces the likelihood of other than negligible charge storage in the presence of even strong radiation environments, without sacrificing the protection afforded the silicon surface by the presence of this passivating layer. From the standpoint of radiation hardening, solely, the ideal situation is a total void between the metal layer and the silicon surface, but since this leads to disadvantages in other areas, such as surface protection, some compromise is necessary.

According to still another aspect of the present invention, the space referred to hereinabove is achieved during the fabrication of the device by inclusion of a layer of spacer material of a thickness dictated by the desired width of the space, and by removing the spacer material using a technique which does not attack the adjacent layers, after the metal layer has been provided atop the spacer layer. Among the several techniques which are readily available for the removal of the spacer material are sublimation or evaporation of the material, washing or etching it out, and subjecting it to plasma ashing. Of these, sublimation or evaporation is most desirable, because it can be achieved after the device has been placed within a suitable container package, and simultaneously with the evacuation of the package to provide an eventual vacuum in the space left after removal of the spacer material.

Therefore, it is another object of the present invention to provide MIS devices in which a gap occurs between the silicon surface and the metal layer to render the device more radiation hardened.

A further object of the invention is to provide an insulated gate field effect transistor in which the metal layer is spaced apart from the insulator layer to markedly decrease the capability of the device to retain a radiation-induced charge between the gate electrode and the channel of the transistor.

Still another object of the present invention is to provide processes for fabricating MIS devices in which the metal layer and the insulator layer are separated from one another by an open space.

BRIEF DESCRIPTION OF THE DRAWING

In describing the present invention, reference will be made, for the sake of example and clarity, to the accompanying FIGS. of drawing in which.

DESCRIPTION OF THE PREFERRED EMBODIMENT

Figure 1:
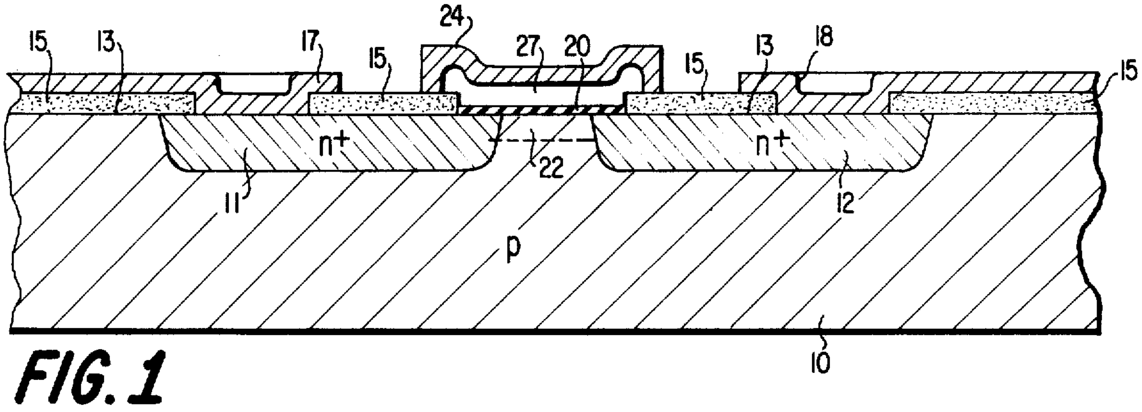
FIG. 1 is a cross-section of an insulated-gate field-effect transistor fabricated according to the invention.

With reference now to the drawing, an insulated-gate field-effect transistor is fabricated according to the present invention in the following manner. A silicon body 10, which is generally part of a larger silicon wafer ultimately to be diced into individual or integrated circuit devices, forms a substrate of p-type (or n-type) conductivity. A pair of heavily doped $n^+$ (or $p^+$) regions 11, 12 are formed in a major surface 13 of the silicon body by diffusion of an appropriate impurity into that surface via windows in a mask. The two $n^+$ (or $p^+$) regions 11, 12 are separated from one another by a portion of the original intrinsic silicon extending to the major surface 13.

A passivating layer 15 of suitable insulating material compatible with the silicon, such as a layer of silicon dioxide ($SiO_2$), is then grown on the surface 13 and windows are etched in this layer to expose the $n^+$ ($p^+$) regions 11, 12 at that surface. Alternatively, this passivating layer 15 with the windows may simply be the mask through which the $n^+$ regions are diffused. In the latter event, the thinner oxide layer which is spontaneously formed over the surface 13 in the windows during the diffusion process is thereafter removed, to expose the $n^+$ (or $p^+$) regions for subsequent deposition of an overlying metal layer thereon constituting respective source and drain contacts 17, 18. Preferably, layer 15 is of the order of 1 micron ($\mu$) thick or greater.

Up to this point of the description, the process utilized to fabricate the IGFET follows conventional MIS techniques. According to the present invention, the portion of the silicon surface 13 between the two $n^+$ (or $p^+$) regions 11, 12 and to which the intrinsic silicon substrate extends is exposed as by etching the $SiO_2$ passivating layer 15. This exposed surface portion may extend slightly beyond the limits of the intervening substrate region between $n^+$ source and drain regions 11, 12, to expose a slight amount of the surface of the latter regions as well. A very thin passsivating layer 20 of insulating material is then provided entirely over the exposed surface portion. Layer 20 functions to protect the silicon surface beneath the gate electrode which is subsequently to be deposited, and to resist the charging effects attributable to ionizing radiation. Since it is in intimate contact with the silicon surface 13, it must be compatible with the silicon and therefore it should possess many of the same properties of silicon dioxide. We have found that aluminum oxide, $Al_2O_3$, deposited to a thickness of from 50 to 100 angstroms (A), but preferably as thin a layer as is possible with available apparatus and techniques, appears to be best suited to these functions. Clearly, however, a layer of $SiO_2$ of similar thinness, or a combination of two or more insulating layers, such as silicon nitride ($Si_3N_4$) atop $SiO_2$, might alternatively be utilized as thin passivating layer 20. The problem encountered when two or more layers are sought to be laid down is that the cumulative thickness is necessarily greater than a single layer thickness. The most desirable situation from the standpoint of the present invention, is the complete absence of any passivating layer 20, but this leads to other practical problems which are otherwise difficult to circumvent, such as adequate protection of the silicon surface. A layer of $Al_2O_3$ of suitable thinness may be put on the exposed silicon surface of the substrate by conventional thin film sputtering techniques.

Figure 2:
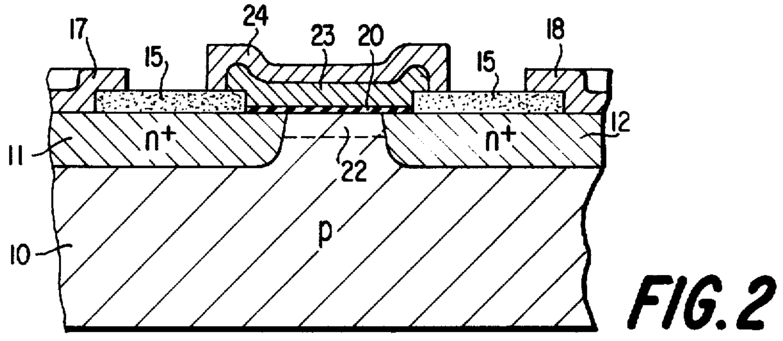
FIG. 2 is a fragmentary cross-section of the IGFET of FIG. 1 prior to removal of the spacer material.
Figure 3:
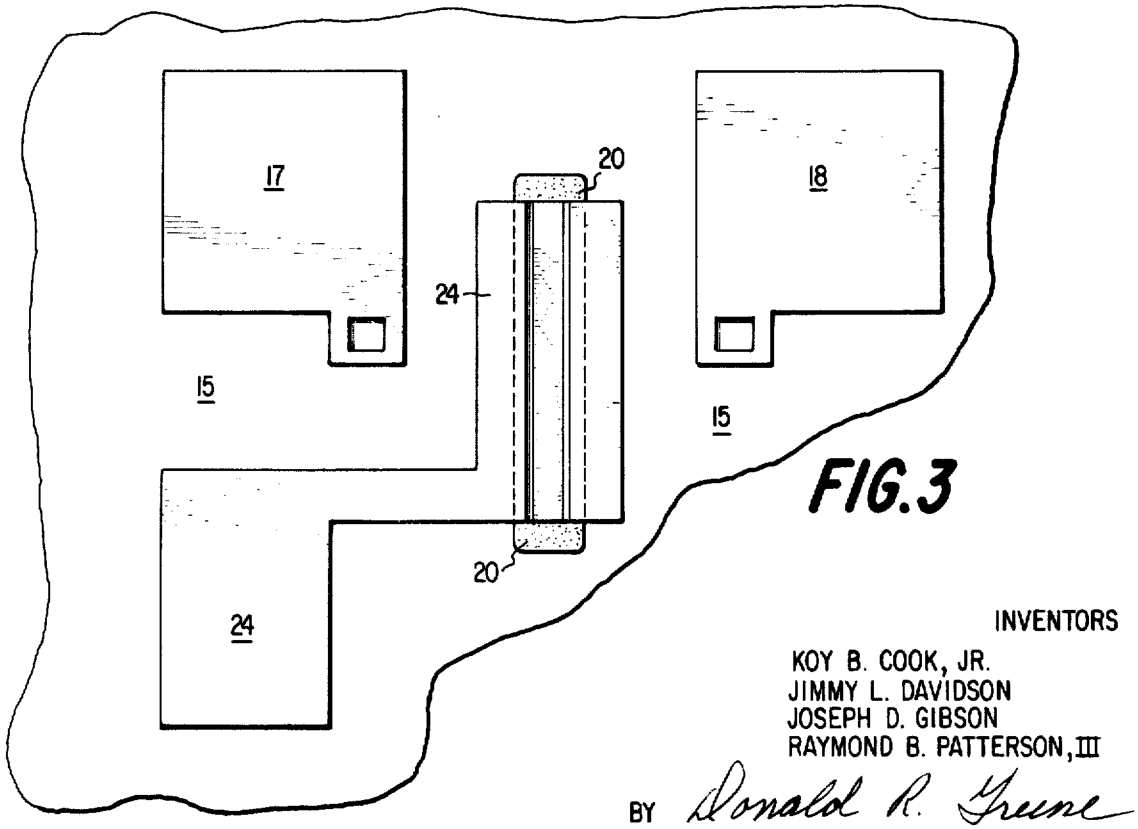
FIG. 3 is a plan view showing the geometry of the IGFET of FIG. 1.

After the thin passivating layer 20 has been deposited on the substrate above the channel 22 (region between the $n^+$, or $p^+$, regions 11, 12) and any portion of the adjacent surface area which had been exposed, a thicker layer 23 of spacer material (FIG. 2) is deposited atop layer 20. The spacer material is to be removed as completely as is possible during subsequent processing, and hence its composition depends heavily upon the nature of the removal step which is to be used, as well as the degree of control which can be exercised over its geometry by standard methods. Three basic alternative techniques have been utilized for the removal of the spacer material and will be discussed in detail presently, but they are by no means to be considered as exhaustive of the possibilities and it is apparent that suitable alternatives will suggest themselves to persons skilled in the pertinent art. Regardless of the specific composition of the spacer material, examples of which will be set forth below, this layer is preferably much thicker than the passivating layer 20, and a minimum of about 500 A in thickness. Here again, the basic criterion is how readily the spacer material may be removed without damage to adjacent layers.

Following the deposition of spacer layer 23, a metal layer 24 is deposited over the latter layer and onto the adjacent oxide layers 15 as a gate electrode or contact. Preferably, this step is performed simultaneously with the deposition of source and drain electrodes, or contacts, 17 and 18, respectively, on the exposed silicon surfaces of the $n^+$ (or $p^+$) regions 11, 12. Gold, aluminum, polysilicon, or any other metal conventionally employed for the purpose, is utilized as the electrode material. Preferably, the gate contact 24 has a thickness of the order of one micron or greater.

It is preferred that the space 27 (FIG. 1) which is to be left between thin passivating layer 20 and gate contact 24 contain a gas at lower than atmospheric pressure, and more specifically, that it approach a vacuum of from $10^{-6}$ to $10^{-7}$ Torr. Under the latter conditions, the removal of spacer layer 23 is most conveniently and desirably achieved by sublimation or evaporation of that layer during evacuation of the container in which the IGFET (and other attached devices, if present) is housed. Typically, the device is to be housed in a conventional flat package (the so-called flatpack) or a cylindrical can of the TO-5 or related type (not shown). Standard techniques of evacuation and hermetic sealing of such packages are well known and need not be discussed in detail here. Suffice it to state that materials capable of sublimation or evaporation must do so at reasonable temperatures and pressures in order to be suitable for use as the spacer material, and in order to be sublimated or evaporated during the container evacuation process. In general, the lower the pressure, the lower the evaporation temperature. Therefore, the provision of high vacuum or near vacuum conditions prior to or during evaporation of the spacer material is desirable also to enable the inclusion of a greater number of materials as potential spacer materials which will evaporate below the eutectic temperature of aluminum and silicon, for example. Clearly, if the aluminum-silicon eutectic is reached before the spacer material will evaporate or sublimate, the material is unsuitable because it will result in damage to the IGFET.

One suitable material for spacer layer 23 is cadmium. Cadmium is compatible with both the underlying and overlying layers of the device, in that it will not attack or degrade those layers. In addition, cadmium is readily deposited to carefully controlled thickness, and is rapidly evaporated at a temperature of about 400° to 450°C, below the Si-Al eutectic temperature of about 550°C, at a pressure of the order of $10^{-6}$ to $10^{-7}$ Torr. Magnesium is effective as a spacer material but is less desirable than cadmium because it tends to evaporate slowly at reasonable temperatures. Other more desirable spacer materials, relative to magnesium, are cadmium sulfide, rubidium, tellurium, and europium, to name a few. Conveniently, the chip containing the IGFET is mounted on a header in a metal can. The entire assembly is then placed in a vacuum system, and is heated to evaporate or sublimate the spacer material while the vacuum system is evacuated. Particles of the vaporized spacer material are drawn out of the metal container via the gap between can and header or thru some other exit port provided in the can during the evacuation process, and the can and header are ultimately hermetically sealed.

Another technique that may be utilized to remove the spacer material is to etch it or wash it out. Here again, prime consideration must be given to the materials between which the spacer layer is interposed. The etch or the wash should not be of a type that will react with either of these adjacent materials or with other materials of which the device is composed and with which it may come in contact. Common forms of photoresist (e.g., KPR, KMER, and so forth, products of Eastman Kodak Co.) may be deposited as the spacer layer to controlled thickness, and dissolved away with standard solvents without harm to the adjacent layers. Calcium floride (CaF), another suitable spacer material for use with this technique, is readily deposited and is conveniently washed away with water.

Yet another technique of removing the spacer material involves the use of conventional plasma ashing process. An organic spacer material, such as KPR, is preferentially attacked by an oxygen-containing plasma, which converts the spacer material to an ash that is readily removed by washing.

If either of the latter two techniques is employed, the evacuation is subsequently performed. Alternatively, the space between the gate contact 24 and thin passivating layer 20 may contain air, nitrogen, or other gas at atmospheric pressure or below. The important point is that the presence of an empty space in this position prevents the development or retention of a radiation-induced charge between the gate and the channel. The isolated gate electrode is supported at either side by the adjacent oxide layers 15, and hence the space remains of fixed width.

Operation of the insulated-gate field-effect transistor of the present invention is identical to that of prior art IGFET's, except for its enhanced radiation hardness. Obviously, opposite conductivity-type devices could also be fabricated. As previously observed, the principles of the present invention are applicable to other MIS devices, such as capacitors, where radiation hardening is necessary or desirable.

It should be apparent from the foregoing disclosure that the present invention is not to be taken as limited to the processes, structure or applications which have been described in connection with the exemplary embodiment, since variations thereof will readily suggest themselves to those ordinarily skilled in the art to which the invention applies. Limitations should be imposed only to the extent required by the appended claims.

What is claimed is:

1. An insulated-gate field-effect transistor, comprising a silicon body having a preselected conductivity type and having a major planar surface, a pair of spaced-apart source and drain regions of opposite conductivity type from said preselected conductivity type, extending into said silicon body from said major surface thereof and defining a channel for charge carriers therebetween closely adjacent said major planar surface, and a gate electrode overlying said channel and separated from said major planar surface thereat at least in part by a gap, said gate electrode being of generally rectangular shape with long sides and relatively shorter ends, said gate electrode being supported along both of said long sides, said gap remaining of substantially fixed width during operation of said transistor and contributing to the radiation hardening of said transistor.

2. The invention according to claim 1, wherein is further included an insulating layer overlying and in intimate contact with said major surface at said channel, said gap existing between said insulating layer and said gate electrode.

3. The invention according to claim 2, wherein said gap is much wider than the thickness of said insulating layer.

4. The invention according to claim 3, wherein said gap is approximately 500A wide.

5. The invention according to claim 3, wherein said insulating layer is $Al_2O_3$.

6. The invention according to claim 3, wherein said gap is a partial vacuum.

* * * * *